(12) United States Patent
Shao et al.

(10) Patent No.: US 10,546,549 B2
(45) Date of Patent: Jan. 28, 2020

(54) SHIFT REGISTER UNIT AND ITS DRIVING METHOD, GATE DRIVE CIRCUIT AND DISPLAY DEVICE (71) Applicants: Boe Technology Group Co., LTD., Beijing (CN); Hefei Boe Optoelectronics Technology Co., LTD., Hefei, Anhui (CN)

(72) Inventors: Xianjie Shao, Beijing (CN); Xiaohe Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/907,215

(22) PCT Filed: Aug. 17, 2015

(86) PCT No.: PCT/CN2015/087211
§ 371 (c)(1),
(2) Date: Jan. 22, 2016

(87) PCT Pub. No.: WO2016/145780
PCT Pub. Date: Sep. 22, 2016

(65) Prior Publication Data
US 2017/0032750 A1 Feb. 2, 2017

(30) Foreign Application Priority Data
Mar. 17, 2015 (CN) .......................... 2015 1 0116501

(51) Int. Cl.
G09G 3/36 (2006.01)

(52) U.S. Cl.
CPC ....... *G09G 3/3648* (2013.01); *G09G 2300/04* (2013.01); *G09G 2310/08* (2013.01)

(58) Field of Classification Search
CPC ............. G09G 3/3648; G09G 2300/04; G09G 2310/08; G09G 2310/0286; G09G 3/3677; G11C 19/28
See application file for complete search history.

(56) References Cited

U.S. PATENT DOCUMENTS

2011/0228893 A1    9/2011  Tobita et al.
2013/0016804 A1*   1/2013  Ahn ...................... G11C 19/28
                                                        377/64

(Continued)

FOREIGN PATENT DOCUMENTS

CN    202443728    9/2012
CN    102956213    3/2013

(Continued)

OTHER PUBLICATIONS

Office Action in Chinese Application No. 201510116501.0 dated Dec. 29, 2016, with English translation. 9 pages.

(Continued)

*Primary Examiner* — Stephen S Hong
*Assistant Examiner* — Ahamed I Nazar
(74) *Attorney, Agent, or Firm* — Womble Bond Dickinson (US) LLP (57) ABSTRACT The present invention provides a shift register unit and its driving method, a gate drive circuit and a display device, which can at least partially alleviate the problem of noise interference caused by non-release of the coupling capacitance of the thin film transistor itself in the GOA circuit. The shift register unit comprises: a pull-up control module for transmitting voltage of a first voltage terminal to a pull-up control node under the control of a first signal input terminal;

(Continued)

a reset module for pulling down the potential of said pull-up control node to a voltage of a second voltage terminal under the control of a second signal input terminal; an output module for transmitting a signal input through a first clock signal terminal to a signal output terminal under the control of said pull-up control node; a first control module for pulling down the potential of the signal output terminal to the voltage of the second voltage terminal under the control of a second clock signal terminal; a second control module for pulling up or down the potential of the pull-up control node to a voltage of the first signal input terminal under the control of the second clock signal terminal.

4 Claims, 4 Drawing Sheets

(56) References Cited

U.S. PATENT DOCUMENTS

| | | | | |
|---|---|---|---|---|
| 2014/0064439 A1* | 3/2014 | Qing | ............... | G11C 19/28 377/75 |
| 2014/0078124 A1* | 3/2014 | Chen | ............... | G09G 3/3266 345/205 |
| 2014/0119490 A1* | 5/2014 | Yang | ............... | G09G 3/3677 377/64 |
| 2014/0126684 A1* | 5/2014 | Ma | ............... | G11C 19/287 377/64 |
| 2014/0133621 A1 | 5/2014 | Shang | | |
| 2014/0160000 A1* | 6/2014 | Ma | ............... | G11C 19/28 345/100 |
| 2014/0176410 A1* | 6/2014 | Ma | ............... | G09G 3/3622 345/92 |
| 2014/0240209 A1* | 8/2014 | Zhang | ............... | G09G 3/3648 345/92 |
| 2015/0243367 A1* | 8/2015 | Gu | ............... | G11C 19/28 377/64 |
| 2015/0339999 A1* | 11/2015 | Zheng | ............... | G11C 19/28 345/92 |
| 2015/0371716 A1* | 12/2015 | Gu | ............... | G11C 19/287 345/100 |
| 2016/0189799 A1* | 6/2016 | Cao | ............... | G09G 3/20 377/64 |
| 2016/0260398 A1 | 9/2016 | Yao et al. | | |
| 2017/0032750 A1* | 2/2017 | Shao | ............... | G09G 3/3648 |

FOREIGN PATENT DOCUMENTS

| | | | |
|---|---|---|---|
| CN | 104078017 A | | 10/2014 |
| CN | 104240766 | | 12/2014 |
| CN | 102956213 B | * | 1/2015 |
| CN | 104299589 A | | 1/2015 |
| CN | 104637462 | | 5/2015 |
| KR | 1020070002784 | | 1/2007 |
| KR | 101255269 | | 4/2013 |

OTHER PUBLICATIONS

International Search Report and Written Opinion with English Language Translation, dated Nov. 30, 2015, Application No. PCT/CN2015/087211.
Chinese office action with English Language Translation attached, dated Jul. 5, 2016, Chinese Application No. 201510116501.0.
Office Action in Chinese Application No. 201510116501.0 dated Apr. 18, 2017, with English translation.
"Fourth office action," CN Application No. 201510116501.0 (dated Nov. 14, 2017).
"Decision on Rejection," CN Application No. 201510116501.0 (dated May 24, 2018).

* cited by examiner

SHIFT REGISTER UNIT AND ITS DRIVING METHOD, GATE DRIVE CIRCUIT AND DISPLAY DEVICE

TECHNICAL FIELD

The present invention relates to the technical field of display, in particular to a shift register unit and its driving method, a gate drive circuit and a display device.

BACKGROUND OF THE INVENTION

A Liquid Crystal Display (LCD) is widely used in such electronic products as notebook computers, flat screen televisions or mobile phones owing to its merits of low radiation, small volume, low energy consumption, etc. A LCD is formed by pixels arranged in the form of a matrix. When a LCD displays, a data drive circuit can latch input display data and clock signals regularly and sequentially, and convert them into analog signals to be input into data lines of a liquid crystal panel, while a gate drive circuit can convert the input clock signals into a voltage for controlling ON/OFF of the pixels through a shift register, and apply said voltage to gate lines of the liquid crystal panel line by line.

In order to further reduce the manufacturing cost for LCD products, the existing gate drive circuit usually adopts the design of GOA (Gate Driver on Array), wherein a TFT (Thin Film Transistor) gate switch circuit is integrated on an array substrate of a display panel so as to form a scan drive for the display panel. Such a gate switch circuit integrated on the array substrate by means of GOA technology is also called a GOA circuit or shift register circuit.

In the prior art, a GOA circuit usually includes a plurality of TFTs. Since some transistors (such as drive transistors) are large in size as compared to other logical transistors, the coupling capacitance of the drive circuit itself is large. When the quantity of electricity in the coupling capacitance of the drive circuit itself is not fully released, the GOA circuit will have a high output noise, thus reducing stability of output of the GOA circuit.

SUMMARY OF THE INVENTION

In order to at least partially alleviate the problem of noise interference caused by non-release of the coupling capacitance of the TFT itself in the GOA circuit, the present invention provides a shift register unit and its driving method, a gate drive circuit and a display device.

According to one aspect of the present invention, a shift register unit is provided, which comprises a pull-up control module, a reset module, an output module, a first control module and a second control module. Said pull-up control module is connected to a first signal input terminal, a first voltage terminal and a pull-up control node for transmitting voltage of the first voltage terminal to said pull-up control node under the control of a signal input through said first signal input terminal. Said reset module is connected to a second signal input terminal, a second voltage terminal and the pull-up control node for pulling down the potential of said pull-up control node to a voltage of the second voltage terminal under the control of a signal input through said second signal input terminal. Said output module is connected to a first clock signal terminal, the pull-up control node and a signal output terminal for transmitting a signal input through the first clock signal terminal to the signal output terminal under the control of said pull-up control node. Said first control module is connected to a second clock signal terminal through a pull-down control node, and it is also connected to said signal output terminal and said second voltage terminal for pulling down the potential of said signal output terminal to the voltage of said second voltage terminal under the control of a signal input through said second clock signal terminal. Said second control module is connected to said second clock signal terminal through said pull-down control node, and it is also connected to said first signal input terminal and said pull-up control node for pulling up or down the potential of said pull-up control node to a voltage of said first signal input terminal under the control of the signal input through said second clock signal terminal.

According to another aspect of the present invention, a gate drive circuit is provided, which comprises at least two stages of any kind of shift register unit as described above. A first signal input terminal of a first stage of shift register unit is connected to a starting signal terminal. Except for the first stage of shift register unit, a first signal input terminal of each of the rest shift register units is connected to a signal output terminal of an adjacent previous stage of shift register unit. Except for the last stage of shift register unit, a second signal input terminal of each of the rest shift register units is connected to a signal output terminal of an adjacent next stage of shift register unit. A second signal input terminal of said last stage of shift register unit is connected to a reset signal terminal.

According to still another aspect of the present invention, a display device is provided, which comprises the gate drive circuit as mentioned above.

According to still another aspect of the present invention, a driving method for driving said shift register unit is provided, which comprises: in a first phase, inputting a low level into the first clock signal terminal and the second signal input terminal, inputting a high level into the second clock signal terminal and the first signal input terminal, transmitting, by the pull-up control module, the voltage of the first voltage terminal to the pull-up control node according to the signal input through the first signal input terminal, pulling down, by the first control module, the potential of the signal output terminal through the second voltage terminal under the control of the pull-down control node, and pulling up, by the second control module, the potential of the pull-up control node through the first signal input terminal; in a second phase, inputting a high level into the first clock signal terminal, inputting a low level into the second clock signal terminal, the first signal input terminal and the second signal input terminal, and transmitting, by the output module, the signal input through the first clock signal terminal to the signal output terminal under the control of the pull-up control node; in a third phase, inputting a low level into the first clock signal terminal and the first signal input terminal, inputting a high level into the second clock signal terminal and the second signal input terminal, resetting the potential of the pull-up control node by the reset module according to the signal input through the second signal input terminal, pulling down, by the first control module, the potential of the signal output terminal through the second voltage terminal under the control of the pull-down control node, and pulling down, by the second control module, the potential of the pull-up control node through the first signal input terminal; and in a fourth phase, inputting a low level into the first signal input terminal and the second signal input terminal, when a high level is input into the second clock signal terminal, pulling down, by the first control module, the potential of the signal output terminal through the second voltage terminal, and pulling down, by the second control module, the potential of the pull-up control node through the first signal input terminal.

Embodiments of the present invention provide a shift register unit and its driving method, a gate drive circuit and a display device. Said shift register unit comprises a pull-up control module, a reset module, an output module, a first control module and a second control module. The pull-up control module is connected to a first signal input terminal, a first voltage terminal and a pull-up control node for transmitting voltage of the first voltage terminal to the pull-up control node under the control of a signal input through said first signal input terminal. The reset module is connected to a second signal input terminal, a second voltage terminal and the pull-up control node for pulling down the potential of said pull-up control node to a voltage of the second voltage terminal under the control of a signal input through the second signal input terminal. The output module is connected to a first clock signal terminal, the pull-up control node and a signal output terminal for transmitting a signal input through the first clock signal terminal to the signal output terminal under the control of the pull-up control node. The first control module is connected to a second clock signal terminal through a pull-down control node, and it is also connected to the signal output terminal and the second voltage terminal for pulling down the potential of said signal output terminal to the voltage of the second voltage terminal under the control of a signal input through said second clock signal terminal. The second control module is connected to said second clock signal terminal through the pull-down control node, and it is also connected to the first signal input terminal and the pull-up control node for pulling up or down the potential of the pull-up control node to a voltage of the first signal input terminal under the control of the signal input through said second clock signal terminal.

In this case, the potential of the pull-up control node is pulled up by the pull-up control module, such that the output module transmits the signal output from the first clock signal terminal to the signal output terminal under the control of the pull-up control node, thereby inputting scan signals to corresponding gate lines. In a non-output phase, the reset module can pull down to reset the potential of the pull-up control node, thereby preventing false-output at the signal output terminal due to the rise of the potential of the pull-up control node, which turns on the output module. In addition, in the non-output phase, the first control module can pull down the potential of the signal output terminal so as to release the coupling capacitance of the transistor itself in the output module, thereby reducing the output noise; while the second control module can not only pull up the potential of the pull-up control node, but also pull down the potential of the pull-up control node, thereby reducing noise of the pull-up control node. In summary, the first control module and second control module can reduce the noise of the signal output terminal and pull-up control node of the shift register unit so as to release the coupling capacitance of the transistor itself in the output module, thereby reducing the output noise of the gate drive circuit and improving stability of output of the gate drive circuit.

BRIEF DESCRIPTION OF THE DRAWINGS

To illustrate the embodiments of the present invention or technical solutions of the prior art more clearly, drawings that need to be used for description of the embodiments or the prior art will be introduced briefly. Obviously, the drawings described below are merely some of the embodiments of the present invention, and those ordinarily skilled in the art can obtain other drawings according to these drawings without using any inventive skill.

DETAILED DESCRIPTION OF THE INVENTION

The technical solutions in the embodiments of the present invention will be described clearly and completely below with reference to the drawings. Obviously, the described embodiments are merely some instead of all of the embodiments of the present invention. All other embodiments that can be obtained by those ordinarily skilled in the art on the basis of the embodiments in the present invention without using inventive skills shall fall into the protection scope of the present invention.

Figure 1:
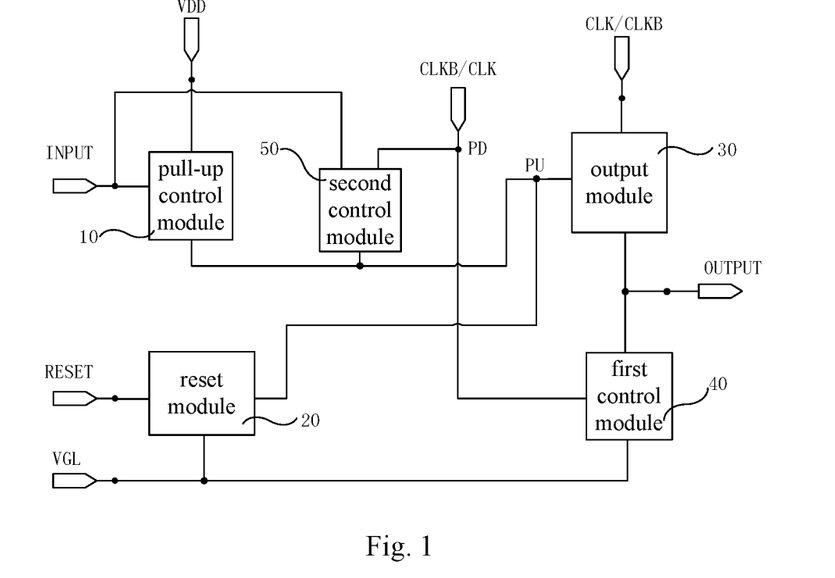
FIG. 1 is a structural diagram of a shift register unit provided by an embodiment of the present invention.

An embodiment of the present invention provides a shift register unit, as shown in FIG. 1, which can comprise a pull-up control module 10, a reset module 20, an output module 30, a first control module 40, and a second control module 50.

Said pull-up control module 10 can be connected to a first signal input terminal INPUT, a first voltage terminal VDD and a pull-up control node PU for transmitting voltage of the first voltage terminal VDD to said pull-up control node PU under the control of a signal input through said first signal input terminal INPUT.

Said reset module 20 can be connected to a second signal input terminal RESET, a second voltage terminal VGL and the pull-up control node PU for pulling down the potential of said pull-up control node PU to a voltage of the second voltage terminal VGL under the control of a signal input through said second signal input terminal RESET so as to reset the pull-down control node PU.

Said output module 30 can be connected to a first clock signal terminal CLK/CLKB, the pull-up control node PU and a signal output terminal OUTPUT for transmitting a signal input through the first clock signal terminal CLK/CLKB to the signal output terminal OUTPUT under the control of said pull-up control node PU.

Said first control module 40 can be connected to a second clock signal terminal CLKB/CLK through a pull-down control node PD, and it is also connected to said signal output terminal OUTPUT and said second voltage terminal VGL for controlling the potential of the pull-down control node through a signal input through said second clock signal terminal CLKB/CLK, and for pulling down the signal output terminal OUTPUT to the voltage of the second voltage terminal VGL under the control of the pull-down control node PD, thereby reducing noise of the signal output terminal OUTPUT.

Said second control module 50 can be connected to said second clock signal terminal CLKB/CLK through said pull-down control node PD, and it is also connected to said first signal input terminal INPUT and said pull-up control node PU for controlling the potential of said pull-down control node through the second clock signal terminal CLKB/CLK, and for pulling up or down the potential of the pull-up control node PU to a voltage of the first signal input terminal INPUT under the control of the pull-down control node PD.

Figure 2:
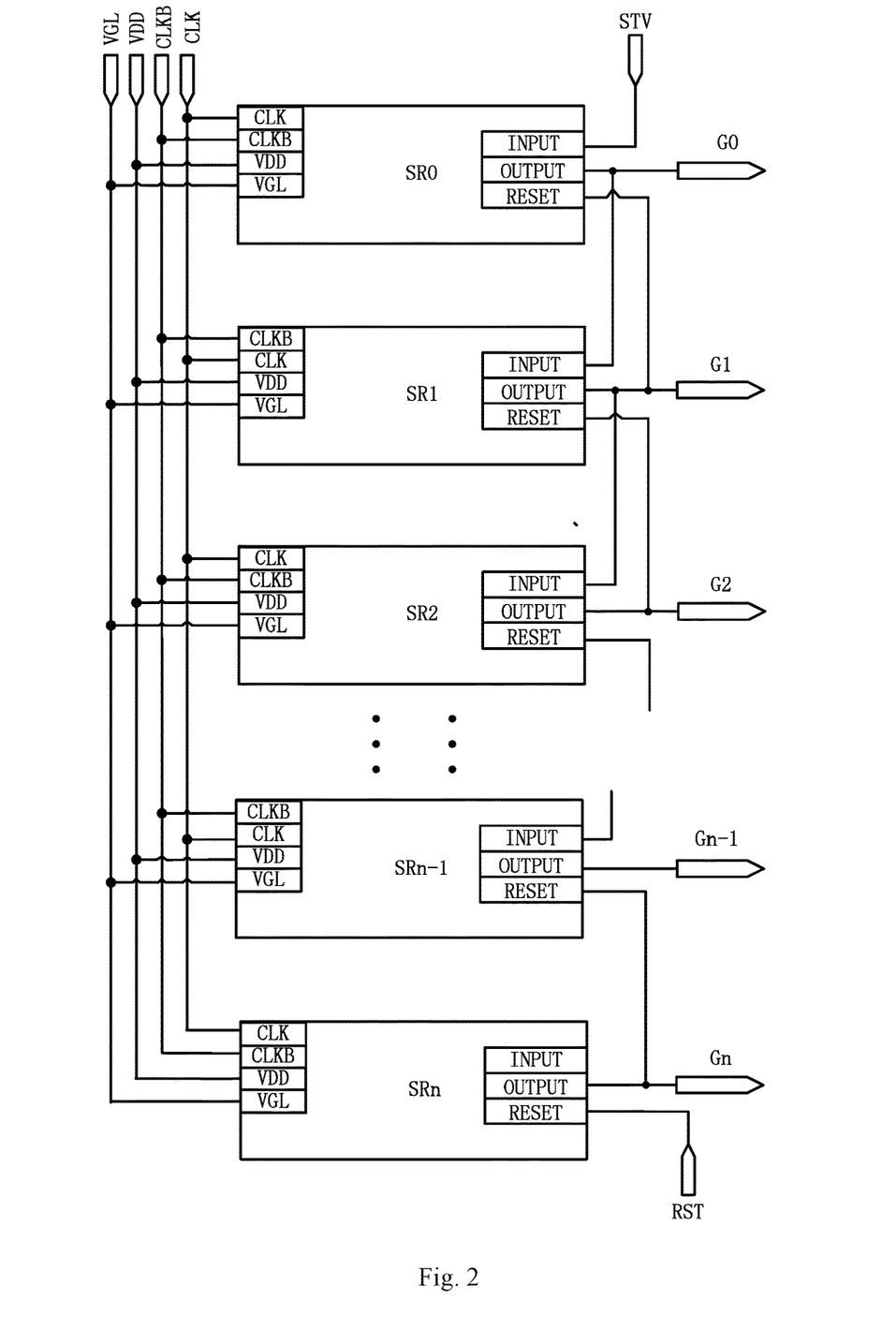
FIG. 2 is a structural diagram of a gate drive circuit formed by cascading a plurality of shift register units as shown in FIG. 1 provided by an embodiment of the present invention.

As shown in FIG. 2, at least two stages of the above-mentioned shift register units (SR0, SR1 . . . , SRn) can form a gate drive circuit, each stage of shift register unit inputs scan signals (G0, G1 . . . , Gn) to each of the gate lines.

The first signal input terminal INPUT of a first stage of shift register unit SR0 receives a starting signal input through a starting signal terminal STV.

Except for the first stage of shift register unit SR0, a first signal input terminal INPUT of each of the rest shift register units is connected to a signal output terminal OUTPUT of an adjacent previous stage of shift register unit.

Except for a last stage of shift register unit SRn, a second signal input terminal RESET of each of the rest shift register units is connected to a signal output terminal OUTOUT of an adjacent next stage of shift register unit.

A second signal input terminal RESET of the last stage of shift register unit SRn can input a reset signal input through a reset signal terminal RST.

The above-mentioned gate drive circuit has the same advantageous effects as the shift register unit as described in the previous embodiments. Since the structure and advantageous effects of the shift register unit have already been described, there will not be elaborated any more herein.

The embodiment of the present invention makes an illustration by taking the example that a high level is input into the first voltage terminal VDD and a low level is input into the second voltage terminal VGL. Obviously, the embodiments described are merely some instead of all of the embodiments of the present invention. Based on the embodiments in the present invention, those ordinarily skilled in the art can obtain other embodiments without using any inventive skill.

In the shift register unit as shown in FIG. 1, the clock signal terminal for inputting clock signal CLK or CLKB to the output module 30 is called the first clock signal terminal, which is represented by CLK/CLKB; the clock signal terminal for inputting clock signal CLK or CLKB to the first control module 40 and the second control module 50 is called the second clock signal terminal, which is represented by CLKB/CLK. The clock signal input through the first clock signal terminal CLK/CLKB and clock signal input through the second clock signal terminal CLKB/CLK have opposite directions but the same width. That is, when the first clock signal terminal CLK/CLKB inputs a clock signal CLK, the second clock signal terminal CLKB/CLK inputs a clock signal CLKB; alternatively, when the first clock signal terminal CLK/CLKB inputs a clock signal CLKB, the second clock signal terminal CLKB/CLK inputs a clock signal CLK.

A plurality of the above-mentioned shift register units cascade to form the shift register unit as shown in FIG. 2. For different stages of shift register units, the clock signals input through the first clock signal terminal CLK/CLKB or the second clock signal terminal CLKB/CLK are not completely the same. In FIG. 2, the first port at the upper left corner of each shift register unit is the first clock signal terminal CLK/CLKB as shown in FIG. 1, and the port under said first port is the second clock signal terminal CLKB/CLK as shown in FIG. 1.

For instance, for a shift register unit SR (m) that outputs a scan signal G (m), a clock signal CLK is input into the first clock signal terminal CLK/CLKB thereof, while a clock signal CLKB is input into the second clock signal terminal CLKB/CLK thereof.

For a shift register unit SR (m+1) that outputs a scan signal G (m+1), a clock signal CLKB is input into the first clock signal terminal CLK/CLKB thereof, while a clock signal CLK is input into the second clock signal terminal CLKB/CLK thereof.

Clock signal CLK and clock signal CLKB have opposite directions but the same width. In addition, $0 \leq m \leq n$, in and n are positive integers.

When m=0, for example, for a shift register unit SR0 that can output a scan signal G0, the first clock signal terminal CLK/CLKB connected to the output module 30 inputs a clock signal CLK to said output module 30; and the second clock signal terminal CLKB/CLK connected to the pull-down control node PD inputs a clock signal CLKB to said pull-down control node PD.

For a shift register unit SR1 that can output a scan signal G1, the first clock signal terminal CLK/CLKB connected to the output module 30 inputs a clock signal CLKB to said output module 30; and the second clock signal terminal CLKB/CLK connected to the pull-down control node PD inputs a clock signal CLK to said pull-down control node PD.

Likewise, the clock signals input through the first clock signal terminal CLK/CLKB and the second clock signal terminal CLKB/CLK in the shift register units (SR2, SR3 . . . , SRn) that can output scan signals (G2, G3 . . . , Gn) can be obtained, and repeated description is no longer necessary.

The embodiment of the present invention provides a shift register unit, which comprises a pull-up control module, a reset module, an output module, a first control module and a second control module. The pull-up control module is connected to a first signal input terminal, a first voltage terminal and a pull-up control node for transmitting voltage of the first voltage terminal to the pull-up control node under the control of a signal input through said first signal input terminal. The reset module is connected to a second signal input terminal, a second voltage terminal and the pull-up control node for pulling down the potential of said pull-up control node to a voltage of the second voltage terminal under the control of a signal input through the second signal input terminal. The output module is connected to a first clock signal terminal, the pull-up control node and a signal output terminal for transmitting a signal input through the first clock signal terminal to the signal output terminal under the control of the pull-up control node. The first control module is connected to a second clock signal terminal through a pull-down control node, and it is also connected to the signal output terminal and the second voltage terminal for pulling down the potential of said signal output terminal to the voltage of the second voltage terminal under the control of a signal input through said second clock signal terminal. The second control module is connected to said second clock signal terminal through the pull-down control node, and it is also connected to the first signal input terminal and the pull-up control node for pulling up or down the potential of the pull-up control node to a voltage of the first signal input terminal under the control of the signal input through said second clock signal terminal.

In this case, the potential of the pull-up control node is pulled up by the pull-up control module, such that the output module transmits the signal output from the first clock signal terminal to the signal output terminal under the control of the pull-up control node, thereby inputting scan signals to corresponding gate lines. In a non-output phase, the reset module can pull down to reset the potential of the pull-up control node, thereby preventing false-output at the signal output terminal due to the rise of the potential of the pull-up control node, which opens the output module. In addition, in the non-output phase, the first control module can pull down the potential of the signal output terminal so as to release the coupling capacitance of the transistor itself in the output module, thereby reducing the output noise; while the second control module can not only pull up the potential of the pull-up control node, but also pull down the potential of the pull-up control node, thereby reducing noise of the pull-up control node. In summary, the first control module and second control module can reduce the noise of the signal output terminal and pull-up control node of the shift register unit so as to release the coupling capacitance of the transistor itself in the output module, thereby reducing the output noise of the gate drive circuit and improving stability of output of the gate drive circuit.

Figure 3:
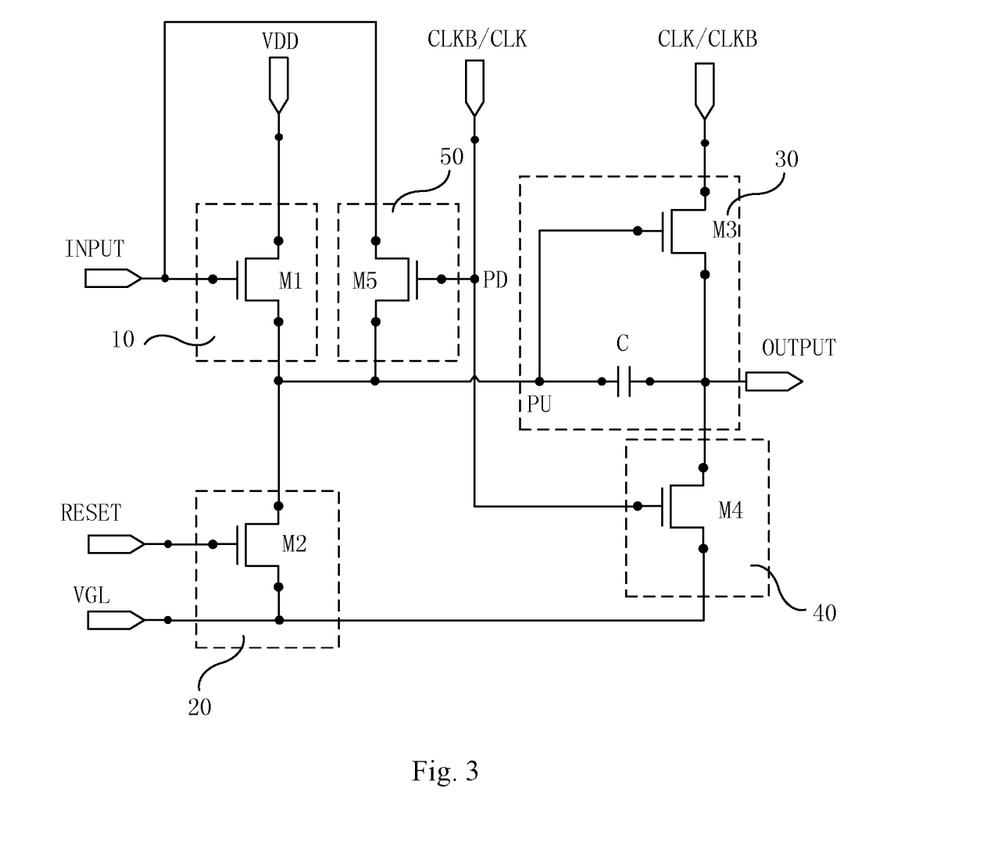
FIG. 3 is a circuit diagram based on the shift register unit as shown in FIG. 1 provided by an embodiment of the present invention.

The specific structure of the shift register unit as shown in FIG. 3 will be described in detail below by way of an example.

The pull-up control module 10 may comprise: a first transistor M1 having its gate connected to the first signal input terminal INPUT, its first electrode connected to the first voltage terminal VDD and its second electrode connected to the pull-up control node PU.

When the signal input through the first signal input terminal INPUT turns on the first transistor M1, the potential of the pull-up control node PU can be pulled up by the first transistor M1 to the voltage of the first voltage terminal VDD, and a capacitor C can be charged through the pull-up control node PU so as to prepare for the shift register unit to output scan signals.

The reset module 20 may comprise a second transistor M2 having its gate connected to the second signal input terminal RESET, its first electrode connected to the pull-up control node PU, and its second electrode connected to the second voltage terminal VGL.

When the signal input through the second signal input terminal RESET turns on the second transistor M2, the potential of the pull-up control node PU can be pulled down by the second transistor M2 to the voltage of the second voltage terminal VGL, so as to reduce noise of said pull-up control node PU, thereby preventing false-output at the signal output terminal OUTPUT of the shift register unit due to the rise of the potential of the pull-up control node PU, which mistakenly turns on the output module 30.

The output module 30 may comprise a third transistor M3 and a capacitor C. The third transistor M3 has its gate connected to the pull-up control node PU, its first electrode connected to the first clock signal terminal CLK/CLKB, and its second electrode connected to the signal output terminal OUTPUT. The capacitor C has its one terminal connected to the pull-up control node PU, and its other terminal connected to the signal output terminal OUTPUT.

Under the control of the pull-up control node PU, the third transistor M3 can be turned on so as to output the signal input through the first clock signal terminal CLK/CLKB to the signal output terminal OUTPUT, and said signal will be used as scan signal (G0, G1 . . . , Gn) to scan the corresponding gate line of the shift register unit (SR0, SR1 . . . , SRn).

The first control module 40 may comprise a fourth transistor M4 having its gate connected to the second clock signal terminal CLKB/CLK through the pull-down control node PD, its first electrode connected to the signal output terminal OUTPUT, and its second electrode connected to the second voltage terminal VGL.

Under the control of the pull-down control node PD, the fourth transistor M4 can be turned on so as to pull down the signal output through the signal output terminal OUTPUT to the voltage of the second voltage terminal VGL, thereby reducing the noise of the signal output terminal OUTPUT.

As a drive transistor, the third transistor M3 has a larger size than other logical transistors (M1, M2, M4, M5), so when the clock signal CLK input through the first signal input terminal CLK/CLKB has a high level, the coupling capacitance of the third transistor M3 itself will produce a high noise voltage. Therefore, when the fourth transistor M4 is turned on, the signal output terminal OUTPUT can be pulled down to the low level input through the second voltage terminal VGL so as to eliminate the noise voltage. In this way, the shift register unit will not be subjected to interference from the noise voltage when outputting scan signals, thus realizing the low voltage output and ensuring signal output stability.

The second control module 50 may comprise a fifth transistor M5 having its gate connected to the second clock signal terminal CLKB/CLK through the pull-down control node PD, its first electrode connected to the first signal input terminal INPUT and its second electrode connected to the pull-up control node PU.

Under the control of the pull-down control node PD, the fifth transistor M5 can be turned on so as to pull up or down the potential of the pull-up control node PU using the signal input through the first signal input terminal INPUT. When a high level is input into the first signal input terminal INPUT, the capacitor can be charged, and when a low level is input into the first signal input terminal INPUT, noise of the pull-up control node PU can be reduced.

It shall be noted that all transistors in the embodiments of the present invention are N-type transistors. The first electrode of a transistor can be a source electrode and the second electrode can be a drain electrode, or the first electrode of a transistor can be a drain electrode and the second electrode can be a source electrode, while the present invention does not make specific limitation in this regard.

Figure 4:
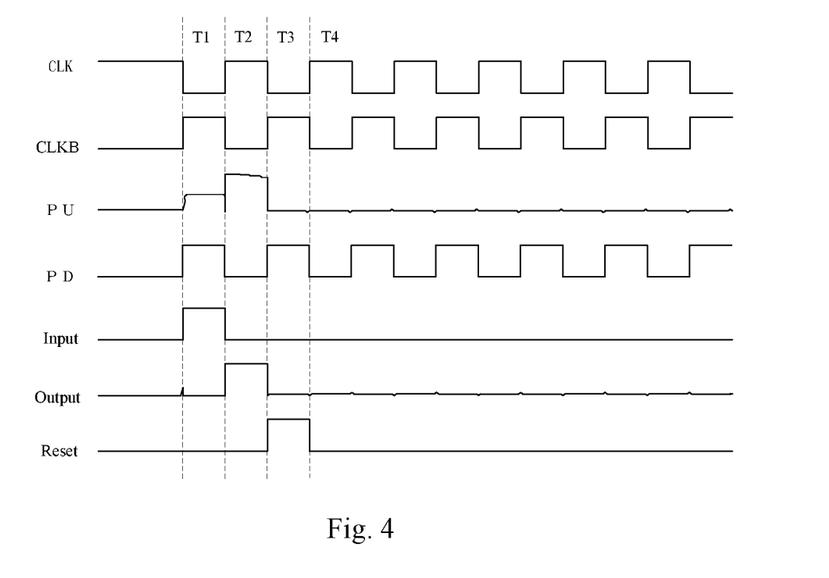
FIG. 4 is a timing diagram of control signals of the shift register unit as shown in FIG. 3 of the present invention.

Referring to the timing diagram of the shift register unit as shown in FIG. 4, the operating process of the shift register unit of FIG. 3 will be described in detail below.

It shall be noted that the shift register units in the embodiment below are exemplified by the first clock signal terminal CLK/CLKB inputting a clock signal CLK and the second clock signal terminal CLKB/CLK inputting a clock signal CLKB.

In the first phase T1, CLK=0; CLKB=1; PU=1; PD=1; INPUT=1; OUTPUT=0; RESET=0. it shall be noted that in the embodiment below, "0" represents a low level, and "1" represents a high level.

A high level is input into the first signal input terminal INPUT to turn on the first transistor M1. The first transistor M1 pulls up the pull-up control node PU to the high level input through the first voltage terminal VDD, and the high level input through the first voltage terminal VDD also charges the capacitor C.

At the same time, the clock signal CLKB input through the second clock signal terminal CLKB/CLK has a high level, so the potential of the pull-down control node PD has a high level. In this case, the fifth transistor M5 is turned on, so that the high level input through the first signal input terminal INPUT is transmitted through the fifth transistor M5 to one terminal (i.e. the pull-up control node PU) of the capacitor C so as to charge the capacitor C.

The pull-down control node PD can also turn on the fourth transistor M4. The fourth transistor M4 pulls down the potential of the signal output terminal OUTPUT to the low level input through the second voltage terminal VGL so as to reduce noise of the signal output terminal OUTPUT, thereby avoiding influence to the signal stability of the output voltage of the signal output terminal OUTPUT caused by the noise voltage produced by the coupling capacitance of the third transistor M3 itself when the clock signal CLK input through the first signal input terminal CLK/CLKB has a high level.

As for the shift register unit SR (m), 0≤m≤n, it can be seen from FIG. 2 that the signal input through the first signal input terminal INPUT is the scan signal G (m−1) output through signal output terminal OUTPUT of the previous stage of shift register unit SR (m−1).

In the second phase T2, CLK=1; CLKB=0; PU=1; PD=0; INPUT=0; OUTPUT=1; RESET=0.

A low level is input into the first signal input terminal INPUT and the second signal input terminal RESET, so the first transistor M1 and the second transistor M2 are in an off state. The clock signal CLKB input through the second clock signal terminal CLKB/CLK has a low level, so the potential of the pull-down control node PD has a low level. In this case, the fifth transistor M5 and the fourth transistor M4 are in an off state.

In addition, under the effect of bootstrapping of the capacitor C, the potential of the pull-up control node PU rises further. The third transistor M3, which functions as a drive transistor, is turned on to transmit the clock signal CLK input through the first clock signal terminal CLK/CLKB to the signal output terminal OUTPUT of the shift register unit. Since the clock signal CLK input through the first clock signal terminal CLK/CLKB has a high level, the high level output through the signal output terminal OUTPUT serves as the scan signal to scan the connected gate lines.

In this phase, the fourth transistor M4 is in an off state, which ensures that the output of the signal output terminal OUTPUT is stable and will not be pulled down by the fourth transistor M4.

In the third phase T3, CLK=0; CLKB=1; PU=0; PD=1; INPUT=0; OUTPUT=0; RESET=1.

A high level is input into the second signal input terminal RESET to turn on the second transistor M2. The second transistor M2 pulls down the potential of the pull-up control node PU to a low level VGL. In this case, the third transistor M3 is in an off state, thus preventing the signal output terminal OUTPUT of the shift register unit from mistakenly outputting scan signals in the non-output phase.

Furthermore, the clock signal CLKB output through the second clock signal terminal CLKB/CLK has a high level so as to pull up the potential of the pull-down control node PD to a high level. In this case, the fifth transistor M5 is turned on. Since a low level is input into the first signal input terminal INPUT at this time, the fifth transistor M5 can be used to reduce the nose of the pull-up control node PU.

Under the control of the pull-down control node PD, the fourth transistor M4 is turned on, so that the potential of the output terminal OUTPUT is pulled down to the low level input through the second voltage terminal VGL so as to reduce the noise of the signal output terminal OUTPUT, thereby avoiding influence to the signal stability of the output voltage of the signal output terminal OUTPUT caused by the noise voltage produced by the coupling capacitance of the third transistor M3 itself when the clock signal CLK input through the first signal input terminal CLK/CLKB has a high level.

As for the shift register unit SR (m), 0≤m≤n, it can be seen from FIG. 2 that the signal input through the second signal input terminal RESET is the scan signal G (m+1) output through signal output terminal OUTPUT of the next stage of shift register unit SR (m+1).

In the fourth phase T4, PU=0; INPUT=0; OUTPUT=0; RESET=0.

A low level is input into the first signal input terminal INPUT and the second signal input terminal RESET, so the first transistor M1 and the second transistor M2 are in an off state. Moreover, since the pull-up control node PU has a low level, the third transistor M3 is in an off state.

When the clock signal CLKB input through the second clock signal terminal CLKB/CLK has a low level, the potential of the pull-down control node PD has a low level. In this case, the fifth transistor M5 and the fourth transistor M4 are in an off state.

When the clock signal CLKB input through the second clock signal terminal CLKB/CLK has a high level, the potential of the pull-down control node PD has a high level. In this case, the fifth transistor M5 and the fourth transistor M4 are turned on. Since a low level is input into the first signal input terminal INPUT, the fifth transistor M5 can be used to reduce noise of the pull-up control node PU.

In addition, the fourth transistor M4 can be used to reduce the noise of the signal output terminal OUTPUT, thereby avoiding influence to the signal stability of the output voltage of the signal output terminal OUTPUT caused by the noise voltage produced by the coupling capacitance of the third transistor M3 itself when the clock signal CLK input through the first signal input terminal CLK/CLKB has a high level.

In summary, phases T1~T3 can be considered as working time of the shift register unit. The signal output terminal OUTPUT outputs a high level only in the second phase T2, so the second phase T2 can be considered as the data output phase of the shift register unit. Phases T1 and T3 are non-output phases of the shift register unit, in which the signal output terminal OUTPUT outputs a low level.

The fourth phase T4 is the non-working time of the shift register unit. Before a high level is input into the first signal input terminal INPUT, the shift register unit maintains at said fourth phase T4.

Moreover, said transistors (M1~M5) may also be P-type transistors. When the transistors in the shift register unit and the transistors connected to the gate lines in the pixel unit are all P-type transistors, the time sequence of the drive signals as well as the input signals of the circuit should be adjusted accordingly.

Specifically, the modules or transistors connected to the second voltage terminal VGL in FIG. 1 or FIG. 3 may be connected to the first voltage terminal VDD, while the modules or transistors connected to the first voltage terminal VDD may be connected to the second voltage terminal VGL. In addition, the direction of the drive signals in FIG. 4 needs to be reversed. The specific operating process is the same as that described above, so it will not be elaborated anymore.

The embodiment of the present invention provides a display device, which comprises any type of gate drive circuit as described above and has the same advantageous effects as those of the gate drive circuit provided in the above embodiment of the present invention. Since the gate drive circuit has already been described in detail in the above embodiment, it will not be covered here.

Said display device can specifically be any liquid crystal display product or component having a display function, such as a liquid crystal display, a liquid crystal television, a digital photo frame, a mobile phone, a tablet computer, etc.

The embodiment of the present invention provides a driving method for driving any one of above-described shift register unit, which may comprise:

In the first phase T1, CLK=0; CLKB=1; PU=1; PD=1; INPUT=1; OUTPUT=0; RESET=0.

The pull-up control module 10 can transmit the voltage of the first voltage terminal VDD to the pull-up control node PU according to the signal input through the first signal input terminal INPUT.

The clock signal input through the second clock signal terminal CLKB/CLK has a high level, so the potential of the pull-down control node PD is pulled up to the high level. In this case, under the control of the pull-down control node PU, the first control module 40 can pull down the potential of the signal output terminal OUTPUT through the second voltage terminal VGL so as to reduce noise of the signal output terminal OUTPUT, thereby avoiding influence to the signal stability of the output voltage of the signal output terminal OUTPUT caused by the noise voltage produced by the coupling capacitance of the third transistor M3 itself when the clock signal CLK input through the first signal input terminal CLK/CLKB has a high level.

A high level is input into the first signal input terminal INPUT, so under the control of the pull-down control node PU, the second control module 50 can pull up the pull-up control node PU using the signal input through the first signal input terminal INPUT.

In the second phase T2, CLK=1; CLKB=0; PU=1; PD=0; INPUT=0; OUTPUT=1; RESET=0.

Under the control of the pull-up control node PU, the output module 30 can transmit the clock signal CLK input through the first clock signal terminal CLK/CLKB to the signal output terminal OUTPUT, so that the signal output terminal OUTPUT outputs scan signals to the gate lines connected to said shift register unit.

In the third phase T3, CLK=0; CLKB=1; PU=0; PD=1; INPUT=0; OUTPUT=0; RESET=1.

The reset module 20 can reset the potential of the pull-up control node PU according to the signal input through the second signal input terminal RESET. Specifically, the potential of the pull-up control node PU can be pulled down to the low level input through the second voltage terminal VGL.

Under the control of the pull-down control node PD, the first control module 40 can pull down the potential of the signal output terminal OUTPUT through the second voltage terminal VGL so as to reduce the noise of the signal output terminal OUTPUT, thereby avoiding influence to the signal stability of the output voltage of the signal output terminal OUTPUT caused by the noise voltage produced by the coupling capacitance of the third transistor M3 itself when the clock signal CLK input through the first signal input terminal CLK/CLKB has a high level.

A low level is input into the first signal input terminal INPUT, so the second control module 50 can pull down the potential of the pull-up control node PU through the first signal input terminal INPUT so as to reduce the noise of the pull-up control node PU.

In the fourth phase T4, PU=0; INPUT=0; OUTPUT=0; RESET=0.

When the clock signal CLKB input through the second clock signal terminal CLKB/CLK has a high level, the first control module 40 can pull down the potential of the signal output terminal OUTPUT through the second voltage terminal VGL so as to reduce the noise of the signal output terminal OUTPUT, thereby avoiding influence to the signal stability of the output voltage of the signal output terminal OUTPUT caused by the noise voltage produced by the coupling capacitance of the third transistor M3 itself when the clock signal CLK input through the first signal input terminal CLK/CLKB has a high level.

In this phase, a low level is input into the first signal input terminal INPUT, so when the clock signal CLKB input through the second clock signal terminal CLKB/CLK has a high level, the second control module 50 reduces the noise of the pull-up control node PU through the first signal input terminal INPUT, thereby preventing the pull-up control node PU from mistakenly turning on the third transistor M3.

Those skilled in the art shall understand that all or some steps for realizing the above method embodiment can be performed by a hardware relating to program instructions. Said program can be stored in a computer readable storage medium, and when being executed, the program executes steps including the above method embodiment. Said storage medium may be various mediums that can store program codes, such as ROM, RAM, magnetic disc or optical disc.

The above described are merely a specific way of implementation of the present invention, but the protection scope of the present invention is not limited to this. Any variations or substitutions that can be easily conceived by a person skilled in the art within the range of technology disclosed by the present invention shall fall into the protection scope of the present invention. Therefore, the protection scope of the present invention shall be determined by the protection scope of the appended claims.

The invention claimed is:

1. A shift register unit, comprising:
    a pull-up control circuit, connected to a first signal input terminal, a first voltage terminal and a pull-up control node for transmitting voltage of the first voltage terminal to said pull-up control node under the control of a signal input through said first signal input terminal;
    a reset circuit, connected to a second signal input terminal, a second voltage terminal and the pull-up control node for pulling down the potential of said pull-up control node to a voltage of said second voltage terminal under the control of a signal input through said second signal input terminal;
    an output circuit, connected to a first clock signal terminal, the pull-up control node and a signal output terminal for transmitting a signal input through the first clock signal terminal to the signal output terminal under the control of said pull-up control node;
    a first control circuit, connected to a second clock signal terminal directly through a pull-down control node, and connected to said signal output terminal and said second voltage terminal for pulling down the potential of said signal output terminal to the voltage of said second voltage terminal under the control of a signal input through said second clock signal terminal;
    a second control circuit, connected to said second clock signal terminal directly through said pull-down control node, and connected to said first signal input terminal directly and said pull-up control node for keeping the potential of said pull-up control node consistent with a voltage of said first signal input terminal under the control of the signal input through said second clock signal terminal,
    wherein said pull-up control circuit comprises: a first transistor having its gate connected to the first signal input terminal, its first electrode connected to the first voltage terminal, and its second electrode connected to the pull-up control node;

said reset circuit comprises: a second transistor having its gate connected to the second signal input terminal, its first electrode connected to the pull-up control node, and its second electrode connected to the second voltage terminal;

said output circuit comprises: a third transistor having its gate connected to the pull-up control node, its first electrode connected to the first clock signal terminal, and its second electrode connected to the signal output terminal; and a capacitor having its one terminal connected to the pull-up control node, and its other terminal connected to the signal output terminal;

said first control circuit comprises: a fourth transistor having its gate connected to the second clock signal terminal through the pull-down control node, its first electrode connected to the signal output terminal, and its second electrode connected to the second voltage terminal; and said second control circuit comprises: a fifth transistor having its gate connected to the second clock signal terminal through the pull-down control node, its first electrode connected to the first signal input terminal, and its second electrode connected to the pull-up control node.

2. A gate drive circuit, comprising at least two stages of the shift register unit as claimed in claim 1, wherein, a first signal input terminal of a first stage of shift register unit is connected to a starting signal terminal;

except for the first stage of shift register unit, a first signal input terminal of each of the rest shift register units is connected to a signal output terminal of an adjacent previous stage of shift register unit;

except for the last stage of shift register unit, a second signal input terminal of each of the rest shift register units is connected to a signal output terminal of an adjacent next stage of shift register unit;

a second signal input terminal of said last stage of shift register unit is connected to a reset signal terminal.

3. A display device, comprising the gate drive circuit as claimed in claim 2.

4. A driving method for driving the shift register unit as claimed in claim 1, comprising:

in a first phase, inputting a low level into the first clock signal terminal and the second signal input terminal, inputting a high level into the second clock signal terminal and the first signal input terminal, transmitting, by the pull-up control circuit, the voltage of the first voltage terminal to the pull-up control node according to the signal input through the first signal input terminal, pulling down, by the first control circuit, the potential of the signal output terminal through the second voltage terminal under the control of the pull-down control node, and pulling up, by the second control circuit, the potential of the pull-up control node through the first signal input terminal;

in a second phase, inputting a high level into the first clock signal terminal, inputting a low level into the second clock signal terminal, the first signal input terminal and the second signal input terminal, and transmitting, by the output circuit, the signal input through the first clock signal terminal to the signal output terminal under the control of the pull-up control node;

in a third phase, inputting a low level into the first clock signal terminal and the first signal input terminal, inputting a high level into the second clock signal terminal and the second signal input terminal, resetting the potential of the pull-up control node by the reset circuit according to the signal input through the second signal input terminal, pulling down, by the first control circuit, the potential of the signal output terminal through the second voltage terminal under the control of the pull-down control node, and pulling down, by the second control circuit, the potential of the pull-up control node through the first signal input terminal; and in a fourth phase, inputting a low level into the first signal input terminal and the second signal input terminal, when a high level is input into the second clock signal terminal, pulling down, by the first control circuit, the potential of the signal output terminal through the second voltage terminal, and pulling down, by the second control circuit, the potential of the pull-up control node through the first signal input terminal.

* * * * *